(12) United States Patent
Arakawa et al.

(10) Patent No.: US 8,354,777 B2
(45) Date of Patent: Jan. 15, 2013

(54) PIEZOELECTRIC FILM AND PIEZOELECTRIC DEVICE INCLUDING THE SAME, AND LIQUID DISCHARGE APPARATUS

(75) Inventors: Takami Arakawa, Kanagawa-ken (JP); Yoshikazu Hishinuma, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 591 days.

(21) Appl. No.: 12/566,298

(22) Filed: Sep. 24, 2009

(65) Prior Publication Data
US 2010/0079552 A1    Apr. 1, 2010

(30) Foreign Application Priority Data
Sep. 29, 2008   (JP) ................. 2008-249620

(51) Int. Cl.
*H01L 41/087*   (2006.01)
(52) U.S. Cl. ............ 310/358; 252/62.9 R; 252/62.9 PZ; 257/347
(58) Field of Classification Search .......... 310/358; 252/62.9 R, 62.9 PZ; 257/347
See application file for complete search history.

(56) References Cited

U.S. PATENT DOCUMENTS

| | | | | |
|---|---|---|---|---|
| 4,946,710 | A * | 8/1990 | Miller et al. | 427/126.3 |
| 5,028,455 | A * | 7/1991 | Miller et al. | 427/126.3 |
| 5,116,643 | A * | 5/1992 | Miller et al. | 427/126.3 |
| 5,180,699 | A * | 1/1993 | Terada et al. | 501/134 |
| 5,192,723 | A * | 3/1993 | Fujiu et al. | 501/136 |
| 5,993,901 | A | 11/1999 | Abe | |
| 6,300,212 | B1 | 10/2001 | Inoue et al. | |
| 6,391,814 | B1 | 5/2002 | Tsubokura et al. | |
| 6,409,935 | B1 * | 6/2002 | Miyazawa et al. | 252/62.9 PZ |
| 6,627,104 | B1 * | 9/2003 | Wang et al. | 252/62.9 PZ |
| 7,348,715 | B2 | 3/2008 | Torii et al. | |
| 2008/0259133 | A1 | 10/2008 | Hara et al. | |
| 2010/0079555 | A1 * | 4/2010 | Arakawa | 347/68 |
| 2010/0194824 | A1 * | 8/2010 | Arakawa et al. | 347/68 |
| 2011/0316937 | A1 * | 12/2011 | Arakawa et al. | 347/68 |

FOREIGN PATENT DOCUMENTS

| | | |
|---|---|---|
| EP | 1 906 466 A1 | 4/2008 |
| JP | 6211522 A | 8/1994 |
| JP | 2001019542 A | 1/2001 |
| JP | 2002-503768 | 2/2002 |
| JP | 2003267796 A | 9/2003 |
| JP | 2004075449 A | 3/2004 |
| JP | 2007-335779 | 12/2007 |
| JP | 2008-81802 | 4/2008 |
| JP | 2008-210924 | 9/2008 |
| JP | 2008-218547 | 9/2008 |
| WO | 99/42282 | 8/1999 |

OTHER PUBLICATIONS

H. Kanai et al., "Effect of Stoichiometry on the Dielectric Properties and Life Performance of (Pb0.875Ba0.125)[(Mg1/3Nb2/3)0.5(Zn1/3Nb2/3)0.3Ti0.2]O3 Relaxer Dielectric Ceramic: Part I, Dielectric Properties", J. Am. Ceram. Soc., vol. 76, No. 2, pp. 454-458, 1993.
H. Kenai et al., "Effect of Stoichiometry on the Dielectric Properties and Life Performance of (Pb0.875Ba0.125)[(Mg1/3Nb2/3)0.5(Zn1/3Nb2/3)0.3Ti0.2]O3 Relaxer Dielectric Ceramic: Part II, Life Performance", J. Am. Ceram. Soc., vol. 76, No. 2, pp. 459-464, 1993.

* cited by examiner

*Primary Examiner* — Jaydi San Martin
(74) *Attorney, Agent, or Firm* — Birch, Stewart, Kolasch & Birch, LLP

(57) ABSTRACT

A piezoelectric film of a perovskite oxide represented by a general expression (P) below and has a pyrochlore free single phase perovskite structure with a/b≦1.06.

$$Pb_a(Zr_x,Ti_y,M_{b-x-y})_bO_c \qquad (P)$$

(where, M represents one or more types of metal elements, $0<x<b$, $0<y<b$, $0\leq b-x-y$, and
a:b:c=1:1:3 is standard, but the molar ratio may deviate from the standard within a range in which a perovskite structure can be obtained.)

11 Claims, 6 Drawing Sheets

FIG.7
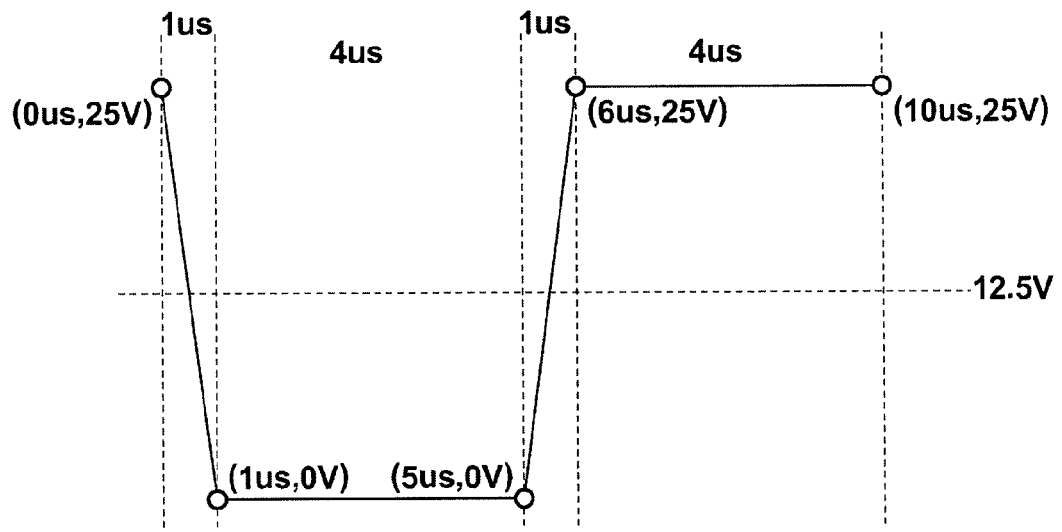
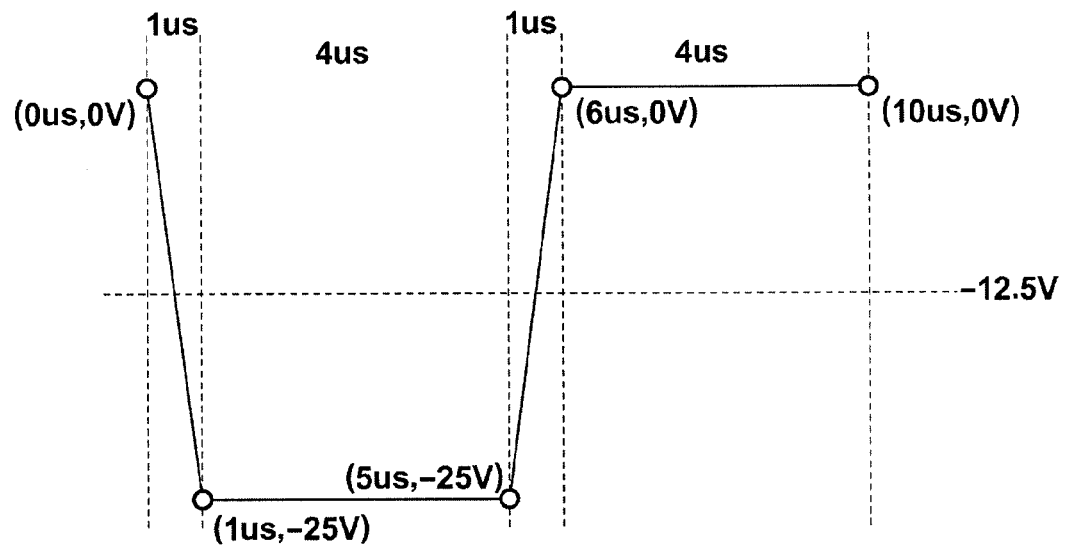

PIEZOELECTRIC FILM AND PIEZOELECTRIC DEVICE INCLUDING THE SAME, AND LIQUID DISCHARGE APPARATUS

BACKGROUND OF THE INVENTION

1. Field of the Invention

The present invention relates to a PZT piezoelectric film and a method for manufacturing the same, a piezoelectric device using the piezoelectric film, and a liquid discharge apparatus.

2. Description of the Related Art

A piezoelectric device which includes a piezoelectric film having piezoelectricity, in which the film stretches or contracts according to the intensity of the applied electric field, and electrodes for applying an electric field to the film is used as an actuator mounted on an inkjet recording head and the like. As for piezoelectric materials, PZT (lead zirconate titanate) and substituted systems of PZT in which a part of A-site and/or B-site is substituted by another element are known. Hereinafter, PZT and substituted systems of PZT are collectively referred to as "PZT system".

It is known that PZT doped with a donor ion having a higher valence number than that of the replaced ion has a higher piezoelectric performance than pure PZT. As donor ions for substituting B-site $Zr^{4+}$ and/or $Ti^{4+}$, $V^{5+}$, $Nb^{5+}$, $Ta^{5+}$, $Sb^{5+}$, $Mo^{6+}$, $W^{6+}$, and the like are known. A PZT system perovskite oxide in which a part of B-site is substituted by another element M may be represented by General Expression (P) below.

$$Pb_a(Zr_x,Ti_y,M_{b-x-y})_bO_c \quad (P)$$

(where, M represents one or more types of B-site elements, $0<x<b$, $0<y<b$, $0\leq b-x-y$, a:b:c=1:1:3 is standard, but the standard molar ratio may deviate within a range in which a perovskite structure can be obtained.)

In the application for the inkjet recording head and the like, it is preferable that the piezoelectric film has a high piezoelectric constant, and a high piezoelectric performance, for example, with piezoelectric constant $d_{31} \geq 150$ pm/V is demanded. Also, for the inkjet recording head, a low replacement frequency of the head is desirable, and hence sufficient durability is demanded for the piezoelectric film in practical use.

For a PZT system perovskite oxide, shortage of Pb causes a pyrochlore phase to be formed and the piezoelectric performance is degraded. Therefore, an A-site rich composition, in which the amount of Pb of an A-site element is greater than the stoichiometric proportion, is regarded to be desirable. The insulation resistance and durability, however, tend to be degraded when the amount of Pb is increased.

In this respect, reference is made to literatures, "Effect of Stoichiometry on the Dielectric Properties and Life Performance of $(Pb_{0.875}Ba_{0.125})[(Mg_{1/3}Nb_{2/3})_{0.5}(Zn_{1/3}Nb_{2/3})_{0.3}Ti_{0.2}]O_3$ Relaxor Dielectric Ceramic: Part I, Dielectric Properties", H. Kanai et al., J. Am. Ceram. Soc., Vol. 76, No. 2, pp. 454-458, 1993 and "Effect of Stoichiometry on the Dielectric Properties and Life Performance of $(Pb_{0.875}Ba_{0.125})[(Mg_{1/3}Nb_{2/3})_{0.5}(Zn_{1/3}Nb_{2/3})_{0.3}Ti_{0.2}]O_3$ Relaxor Dielectric Ceramic: Part II, Life Performance", H. Kanai et al., J. Am. Ceram. Soc., Vol. 76, No. 2, pp. 459-464, 1993, which are about a PZT system dielectric body having a high dielectric constant for a laminated capacitor. The literatures describe that shortage of Pb causes a pyrochlore phase to be formed, but the insulation resistance and durability are improved, so that the high durability and high capacitance can be achieved. For dielectric applications, i.e., applications in which only capacitance is important, the presence of certain amount of pyrochlore phase does not have any impact on use, thus the presence of pyrochlore phase does not pose any big problem.

For piezoelectric applications, however, presence of any pyrochlore phase largely degrades the piezoelectric performance. Further, for piezoelectric applications in which a piezoelectric film having a larger film thickness is used in comparison with that for dielectric applications, the film having pyrochlore phase poses a problem that a crack is likely to occur or the film is likely to be detached from the substrate. Therefore, a piezoelectric film with little amount of Pb and having pyrochlore phase can not be employed in practical use in piezoelectric applications.

U.S. Pat. No. 7,348,715 (Patent Document 1) describes that the durability of a PZT system is improved when the molar ratio a/b between A-site element and B-site element is in the range from 0.85 to less than 1.0 (claim 1). Patent Document 1 does not mention about pyrochlore phase. But, the film is formed by an ordinary vapor phase film forming method (RF magnetron sputtering method) and a specific scheme for preventing formation of pyrochlore phase is not taken. Therefore, formation of pyrochlore phase is unavoidable under the conditions with little amount of Pb described in Patent Document 1.

As described above, the piezoelectric performance and durability are incompatible properties for PZT system piezoelectric films, and the compatibility between them has not been achieved yet.

The present invention has been developed in view of the circumstances described above, and it is an object of the present invention to provide a PZT system piezoelectric film having both excellent piezoelectric performance and durability, and a method for manufacturing the same.

SUMMARY OF THE INVENTION

A piezoelectric film according to the present invention is a piezoelectric film of a perovskite oxide (which may include an unavoidable impurity) represented by a general expression (P) below, in which the film has a pyrochlore free single phase perovskite structure with $a/b \leq 1.06$.

$$Pb_a(Zr_x,Ti_y,M_{b-x-y})_bO_c \quad (P)$$

(where, M represents one or more types of metal elements, $0<x<b$, $0<y<b$, $0\leq b-x-y$, and a:b:c=1:1:3 is standard, but the molar ratio may deviate from the standard within a range in which a perovskite structure can be obtained.)

The term "pyrochlore free" as used herein refers to that no diffraction peak of pyrochlore phase is observed in an ordinary XRD measurement.

A method for manufacturing a piezoelectric film according to the present invention is a method for manufacturing a piezoelectric film of a perovskite oxide (which may include an unavoidable impurity) represented by a general expression (P) below, in which:

the method sequentially performs a process (A) in which film forming is performed under the condition of $a/b \geq 1.07$ and a process (B) in which film forming is performed under the condition of $a/b < 1.07$; and a piezoelectric film having a pyrochlore free single phase perovskite structure with $a/b \leq 1.06$ is manufactured by the method.

$$Pb_a(Zr_x,Ti_y,M_{b-x-y})_bO_c \quad (P)$$

(where, M represents one or more types of metal elements, 0<x<b, 0<y<b, 0≦b-x-y, and a:b:c=1:1:3 is standard, but the molar ratio may deviate from the standard within a range in which a perovskite structure can be obtained.)

A piezoelectric device according to the present invention is a device having the piezoelectric film described above and electrodes for applying an electric field to the film.

A liquid discharge apparatus according to the present invention is an apparatus, including:

the piezoelectric device described above; and a liquid discharge member provided adjacent to the piezoelectric device, the liquid discharge member having a liquid storage chamber for storing a liquid and a liquid discharge opening for discharging the liquid from the liquid storage chamber to the outside according to the application of the electric field to the piezoelectric film.

The present invention has realized a PZT system piezoelectric film having a pyrochlore free single phase perovskite structure with a molar ratio between A-site element and B-site element a/b is not greater than 1.06, i.e., a/b≦1.06, and a method for manufacturing the same. According to the present invention, a PZT system piezoelectric film having both excellent piezoelectric performance and durability, and a method for manufacturing the same are provided.

BRIEF DESCRIPTION OF THE DRAWINGS

FIG. 7 illustrates drive waveforms in an average lifetime measurement.

BRIEF DESCRIPTION OF THE PREFERRED EMBODIMENTS

Figure 1:
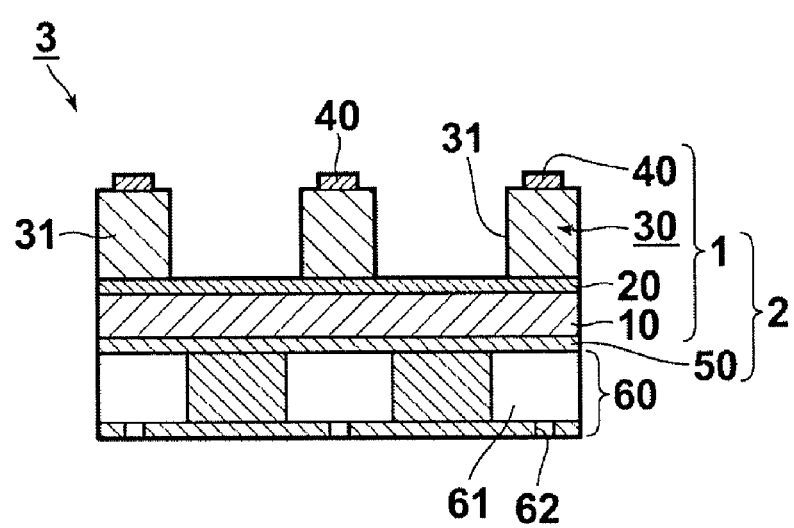
FIG. 1 is a sectional view of a piezoelectric device according to an embodiment of the present invention and an inkjet recording head (liquid discharge apparatus), illustrating the construction thereof.

A piezoelectric film of the present invention is a film of a perovskite oxide (which may include an unavoidable impurity) represented by a general expression (P) below and having a pyrochlore free single phase perovskite structure with a/b≦1.06.

$$Pb_a(Zr_x,Ti_y,M_{b-x-y})_bO_c \quad (P)$$

(where, M represents one or more types of metal elements, 0<x<b, 0<y<b, 0≦b-x-y, and a:b:c=1:1:3 is standard, but the molar ratio may deviate from the standard within a range in which a perovskite structure can be obtained.)

Many reports of PZT system piezoelectric films with a/b≦1.06 have been published prior to the present application, but most of which do not specifically describe pyrochlore phase. As described under the "Description of the Related Art", it has been a common knowledge that pyrochlore phase is formed when a PZT system piezoelectric film with a/b≦1.06 is formed by an ordinary film forming method even where it is not specifically described. The inventors of the present invention have realized a pyrochlore free single phase perovskite structure from a material of low Pb content by devising the manufacturing method.

In bulk ceramics, it has been the case that a/b≦1.06, and PZT system piezoelectric bodies without pyrochlore phase have been obtained, but no report has been found describing a piezoelectric film having such properties.

It is thought that perovskite phase is formed by way of pyrochlore phase. Various reaction pathways of PZT have been proposed. For example, it is thought that the reaction progresses in the following two stages. The following reaction formulae are provided by the inventors of the present invention by rewriting a known relaxor system reaction formula.

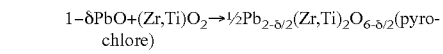

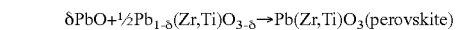

When activation energy is insufficient due to shortage of Pb or temperature, it is thought that pyrochlore phase is likely to be formed because the reaction stops at the first reaction stage. In bulk ceramics, sintering is performed at a high temperature not less than 1000° C., for example, at 1200° C., so that it is thought that activation energy is sufficient for the second stage reaction even when Pb content is relatively low and a PZT system piezoelectric body without pyrochlore phase can be obtained. Likewise, a high temperature sintering is performed in screen printing, so that it is thought that a PZT system piezoelectric body without pyrochlore phase can be obtained.

In vapor phase methods, in general, a film is formed at a temperature lower than that of bulk ceramics, so that pyrochlore phase is formed if the amount of Pb is insufficient. For substrates having silicon, such as silicon substrate, silicon oxide substrate, SOI substrate, and the like, it is essential that film forming be performed at a relatively low temperature of less than 800° C., because at a high temperature of not less than 800° C., lead glass is produced through reaction between Pb and Si and the substrate becomes fragile.

In vapor phase methods using plasma, such as sputtering, plasma CVD, and the like, Pb shortage is likely to occur because Pb reverse sputtering phenomenon is likely to occur. In order to prevent the Pb reverse sputtering, it is thought to be desirable that the film forming be performed at a temperature as low as possible (e.g., less than 600° C.), and hence activation energy shortage is likely to occur. If the film forming temperature is increased for accelerating the reaction, Pb reverse sputtering becomes intense and Pb shortage becomes more significant. In such film forming, it is thought to be effective to shift the reaction equilibrium to right with excessive amount of PbO.

For the reasons described above, no report has been found describing a piezoelectric film of a/b≦1.06 without pyrochlore phase. The present invention is particularly effective to a process of relatively low temperature of less than 800° C. in which a single phase perovskite structure has not been obtained by conventional methods under the condition of low Pb content. That is, the present invention is effective to vapor phase methods, in particular, to vapor phase methods that use plasma, such as sputtering, plasma CVD, and the like. The present invention is effective to substrates having silicon, such as silicon substrate, silicon oxide substrate, SOI substrate, and the like.

Hereinafter, a perovskite oxide represented by the general expression (P) is simply referred to as "perovskite oxide (P)". The perovskite oxide (P) is a pure PZT or a PZT with a part of B-site substituted by M.

x and y of the perovskite oxide (P) do not have any restriction as long as 0<x<b and 0<y<b are satisfied. It is said that PZT system perovskite oxide shows a high piezoelectric performance at and near a morphotropic phase boundary (MPB). PZT system becomes rhombohedral system when Zr is rich, tetragonal system when Ti is rich, and a phase boundary between rhombohedral system and tetragonal system, that is, MPB when Zr/Ti molar ratio is near 55/45. Therefore, x and y of the perovskite oxide (P) are preferable to be or near MPB composition. More specifically, it is preferable that $0.4 \leq y \leq 0.6$ $(0.6 \geq x \geq 0.4)$.

There is not any specific restriction on one or more substitution elements M. It is known that PZT doped with a donor ion having a higher valence number than that of the replaced ion has improved properties, including piezoelectric performance, than pure PZT. Such donor ions include $V^{5+}$, $Nb^{5+}$, $Ta^{5+}$, $Sb^{5+}$, $Mo^{6+}$, $W^{6+}$, and the like. That is, it is preferable that the perovskite oxide (P) is a perovskite oxide (PX) in which $0 \leq b-x-y$ and M includes at least one type of element selected from the group consisting of V, Nb, Ta, and Sb. There is not any specific restriction on b-x-y as long as it is within a range in which a perovskite structure can be obtained. For example, when M is Nb, it is preferable that $0 \leq b-x-y \leq 0.25$ and more preferable that $0 \leq b-x-y \leq 0.2$.

Figure 6:
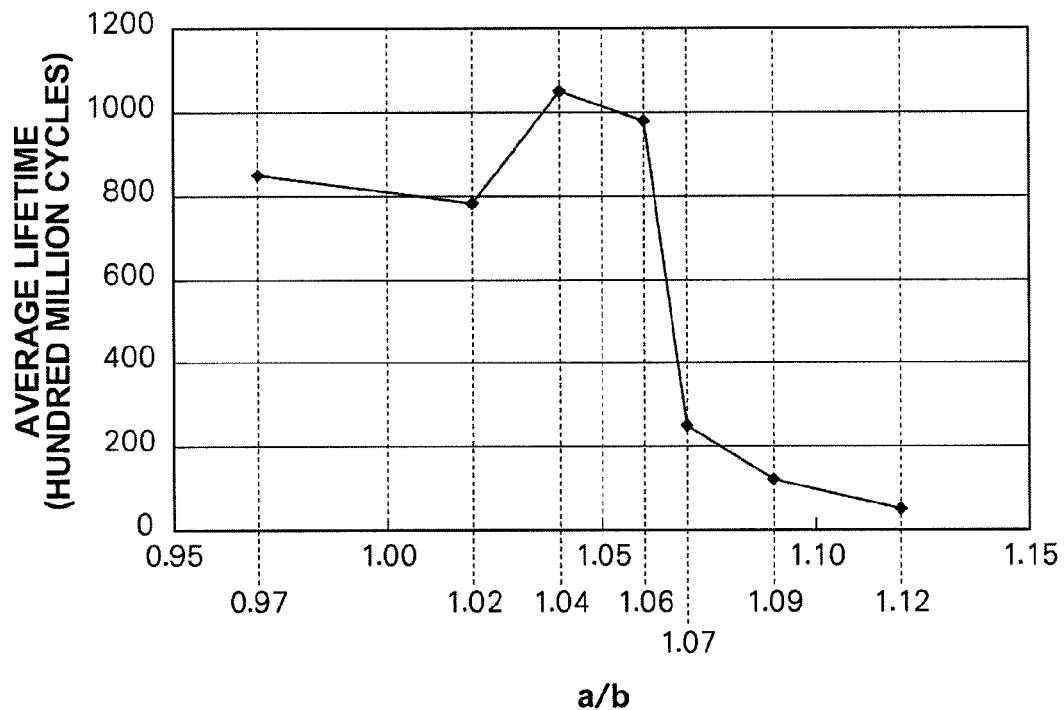
FIG. 6 is a graph illustrating the relationship between a/b and average lifetime in Examples 1 to 4 and Comparative Examples 1 to 3.

The inventors of the present invention have found that high durability can be obtained when $a/b \leq 1.06$ and the durability is dramatically decreased when $a/b \geq 1.07$ and greater (FIG. 6). There is not any specific restriction on the lower limit of a/b as long as it is within a range in which a perovskite structure can be obtained. The inventors of the present invention have realized a high piezoelectric performance by preventing the formation of pyrochlore phase even under a low Pb density condition of $a/b \leq 1.06$ by working out and devising the manufacturing method. The inventors of the present invention have realized a PZT system piezoelectric film having both excellent piezoelectric performance and durability at least in the range of $a/b \geq 0.97$ (Tables 1 and 2, FIG. 6).

The present invention may provide a PZT system piezoelectric film having an average lifetime of not less than 50 billion cycles when measured with the following measurement conditions under the conditions of a temperature of 40° C. and a relative humidity of 80%. The present invention may provide a PZT system piezoelectric film having an average lifetime of not less than 70 billion cycles measured with the measurement conditions described above (Tables 1 and 2, FIG. 6). The measurement conditions are very severe, yet a long lifetime can be obtained. Of course, a longer lifetime may be obtained under the conditions of actual use.

Average Lifetime Measurement Conditions:
Piezoelectric constants $d_{31}$ of the piezoelectric film are measured with the film in the form of a piezoelectric device in which a lower electrode is formed on a substrate side of the piezoelectric film and multiple upper electrodes are formed on a side opposite to the substrate. Each upper electrode has a laminated structure of a 20 nm thick Ti film and a 150 nm thick Pt film stacked in this order and an area of 0.6 mm². A piezoelectric constant $d_{31}$ measured with a sine wave voltage of 1 kHz with an offset of 10 V and an amplitude of ±10 V is defined as $d_{31}(+)$. A piezoelectric constant $d_{31}$ measured with a sine wave voltage of 1 kHz with an offset of −10 V and an amplitude of ±10 V is defined as $d_{31}(-)$. When $d_{31}(+) \geq d_{31}(-)$, a 100 kHz trapezoidal wave of 12.5 V±12.5 V is applied (upper of FIG. 7). When $d_{31}(-) \geq d_{31}(+)$, a 100 kHz trapezoi- dal wave of −12.5 V±12.5 V is applied (lower of FIG. 7). In either case, the application of the voltage is stopped every one billion cycles (every 16.7 minutes, 100 kHz×one billion cycles=16.7) to measure a tan δ value at 1 V, 1 kHz with an LCR meter and a point where the tan δ value exceeds 0.1 is obtained as a lifetime. An average of the measured lifetimes at 20 electrodes randomly selected from the multiple upper electrodes on the piezoelectric film is obtained as the average lifetime.

According to the present invention, a PZT system piezoelectric film having a piezoelectric constant $d_{31}$ not less than 150 pm/V may be provided (Tables 1 and 2). The term "having a piezoelectric constant $d_{31}$ not less than 150 pm/V" as used herein refers to that at least either one of $d_{31}(+)$ and $d_{31}(-)$ defined above is not less than 150 pm/V. The term "piezoelectric constant" as used herein is $d_{31}$, expressed in absolute value, which indicates stretching/contraction along an electrode plane.

The piezoelectric film of the present invention may be manufactured by a manufacturing method having a process (A) in which film forming is performed under the condition of $a/b \geq 1.07$ and a process (B) in which film forming is performed under the condition of $a/b < 1.07$ in series.

In the initial stage of piezoelectric film forming, a film is formed under the condition of $a/b \geq 1.07$ in which single phase perovskite structure can be obtained stably without pyrochlore phase in order to grow a film having good perovskite crystals (process (A)). Then, the film is formed under the condition of $a/b < 1.07$ in which pyrochlore layer is likely to be formed (process (B)). In such method, a film having good perovskite crystals is initially grown, and this functions as the crystal core, so that even when a film is formed thereafter under the condition of $a/b < 1.07$ in which pyrochlore phase is likely to be formed, a good crystal film having a single phase perovskite structure without pyrochlore phase is grown. The composition of the film is distributed in the thickness direction, but the film as a whole falls in $a/b \leq 1.06$. Here, layers formed in process (A) and process (B) are referred to as "initial layer" and "main layer" respectively.

There is not any specific restriction on the film forming method, and vapor phase methods, including sputtering, plasma CVD, MOCVD, PLD, and the like, liquid phase methods, including sol-gel, metal organic decomposition, a aerosol deposition method, and the like may be used. Among these, vapor phase methods, such as sputtering, plasma CVD, MOCVD, PLD, and the like may be preferably used because they allows easy change of a film forming condition that changes a/b during the film forming.

In the vapor phase methods, a/b can be adjusted by changing one or more of the factors related to the film forming, such as the film forming temperature, film forming pressure, and the like. For example, the sputtering is a film forming method in which a substrate and a target are disposed opposite to each other, then a plasmatized gas is collided to the target under reduced pressure, and molecules and atoms released from the target by the collision energy are deposited to the substrate. In the sputtering method, a/b can be adjusted by changing one or more of the factors related to the film forming, such as the target composition, film forming temperature, surface energy of the substrate, film forming pressure, amount of oxygen in ambient gas, plasma potential, distance between substrate and target, and the like.

For example, a/b can be changed easily during film formation by changing the film forming temperature. In this case, film forming may be performed at relatively low temperature in which $a/b \geq 1.07$ in process (A) and film forming may be performed at a relatively high temperature in which $a/b < 1.07$ in process (B). The temperature condition for $a/b \geqq 1.07$ or $a/b<1.07$ is provided by a film forming condition other than the film composition and film forming temperature of a film forming device used.

There is not any specific restriction on a film thickness of an initial layer formed in process (A), and it may be in a range in which a film having good perovskite crystals can be formed evenly and well functions as a crystal core when a film forming condition is changed to cause $a/b<1.07$.

The inventors of the present invention have found that if a film formed in process (A) is excessively thin, such as around 10 nm, then the film does not function well as a crystal core for a film formed in process (B) (Comparative Example 6 to be described later). Preferably, the film thickness of an initial layer formed in process (A) is not less than 30 nm, and more preferably not less than 100 nm (Table 3).

The essential layer to be formed is the main layer, an unnecessarily thick initial layer results only in an increased process time. Further, if the film thickness of an initial layer is too thick, the influence of the initial layer having a high Pb density to the durability is increased, whereby the durability of the film may be degraded. Preferably, the film thickness of an initial layer formed in process (A) is not greater than 1.0 μm, and more preferably not greater than 300 nm.

As described above, the present invention has realized a PZT system piezoelectric film having a pyrochlore free single phase perovskite structure with a molar ratio between A-site element and B-site element $a/b$ is not greater than 1.06, i.e., $a/b \leqq 1.06$, and a method for manufacturing the same. According to the present invention, a PZT system piezoelectric film having both excellent piezoelectric performance and durability, and a method for manufacturing the same may be provided.

[Piezoelectric Device and Inkjet Recording Head]

The structure of a piezoelectric device according to an embodiment of the present invention and an inkjet recording head (liquid discharge device) having the piezoelectric device will be described with reference to FIG. 1. FIG. 1 is a cross-sectional view (cross-sectional view in the thickness direction of the piezoelectric device) of a relevant part of the inkjet recording head. Each of the components is not necessarily drawn to scale for facilitating visibility.

Piezoelectric device 1 of the present embodiment is a device which includes lower electrode 20, piezoelectric film 30, and upper electrode 40 stacked on substrate 10 in this order. An electric field is applied to piezoelectric film 30 in the thickness direction by upper electrode 40 and lower electrode 20.

Lower electrode 20 is formed on substantially the entire surface of substrate 10, then patterned piezoelectric film 30 in which line-like convexes 31 are disposed in a stripe shape, and upper electrode 40 is formed on each convex 31. The pattern of piezoelectric film 30 is not limited to that shown in FIG. 1, and any pattern may be designed as appropriate. Further, piezoelectric film 30 may be a continuous film. But, a patterned piezoelectric film 30 formed of a plurality of separate convexes 31 is preferable, rather than a continuous film, since each convex 31 stretches or contracts smoothly, thereby providing a greater amount of displacement.

There is not any specific restriction on substrate 10 and, for example, substrates of silicon, silicon oxide, stainless (SUS), yttrium-stabilized zirconia (YSZ), alumina, sapphire, SiC, $SrTiO_3$, and the like may be used. Further, as substrate 10, a laminated substrate, such as a SOI substrate having a silicon substrate on which a $SiO_2$ film and a Si active layer are stacked in this order or the like, may be used. The present invention is particularly effective when silicon substrate, silicon oxide substrate, or SOI substrate is used.

There is not any specific restriction on the composition of lower electrode 20 and, a metal, such as Au, Pt, Ir, $IrO_2$, $RuO_2$, $LaNiO_3$, or $SrRuO_3$, a metal oxide, or a combination thereof may be used. There is not any specific restriction on the composition of upper electrode 40, and any of example materials listed for lower electrode 20, an electrode material generally used for semiconductor processing, such as Al, Ta, Cr, or Cu, or a combination thereof may be used. There is not any specific restriction on the thicknesses of lower electrode 20 and upper electrode 40 and are preferable to be in the range from 50 nm to 500 nm.

Piezoelectric film 30 is a film of the present invention formed of a perovskite oxide (P) (which may include an unavoidable impurity) and has a pyrochlore free single phase perovskite structure with $a/b \leqq 1.06$. There is not any specific restriction on the film thickness of piezoelectric film 30 which is normally not less than 1 μm, for example, from 1 to 5 μm. According to the present invention, piezoelectric film 30 having a film thickness of not less than 3.0 μm may be provided.

Piezoelectric actuator 2 includes vibration plate 50, which vibrates according to stretching/contraction of piezoelectric film 30, attached to the lower surface of substrate 10 of piezoelectric device 1. Piezoelectric actuator 2 further includes a control means (not shown), such as a drive circuit or the like, for drive controlling piezoelectric device 1.

Inkjet recording head (liquid discharge device) 3 is a device basically constituted by piezoelectric actuator 2 and an ink nozzle (liquid storage/discharge member) 60, having ink storage chamber (liquid storage chamber) 61 for storing an ink and ink discharge opening (liquid discharge opening) 62 for discharging the ink from ink storage chamber 61 to the outside, attached to the bottom surface of piezoelectric actuator 2. Ink chamber 61 is provided in a plurality according to the number and pattern of convexes 31 of piezoelectric film 30. In inkjet recording head 3, piezoelectric device 1 is stretched or contracted by increasing or decreasing the electric field applied to piezoelectric device 1 to control the ink discharge and discharge amount from ink storage chamber 61.

Instead of attaching vibration plate 50 and ink nozzle 60 made of separate members to substrate 10, portions of substrate 10 may be formed into vibration plate 50 and ink nozzle 60. For example, where substrate 10 is a laminated substrate, such as a SOI substrate, ink storage chamber 61 may be formed by etching substrate 10 from the bottom side, and vibration plate 50 and ink nozzle 60 may be formed by processing the substrate itself.

Piezoelectric film 1 and inkjet recording head of the present embodiment are structured in the manner described above. According to the present embodiment, piezoelectric film having both excellent piezoelectric performance and durability may be provided.

[Inkjet Recorder]

Figure 2:
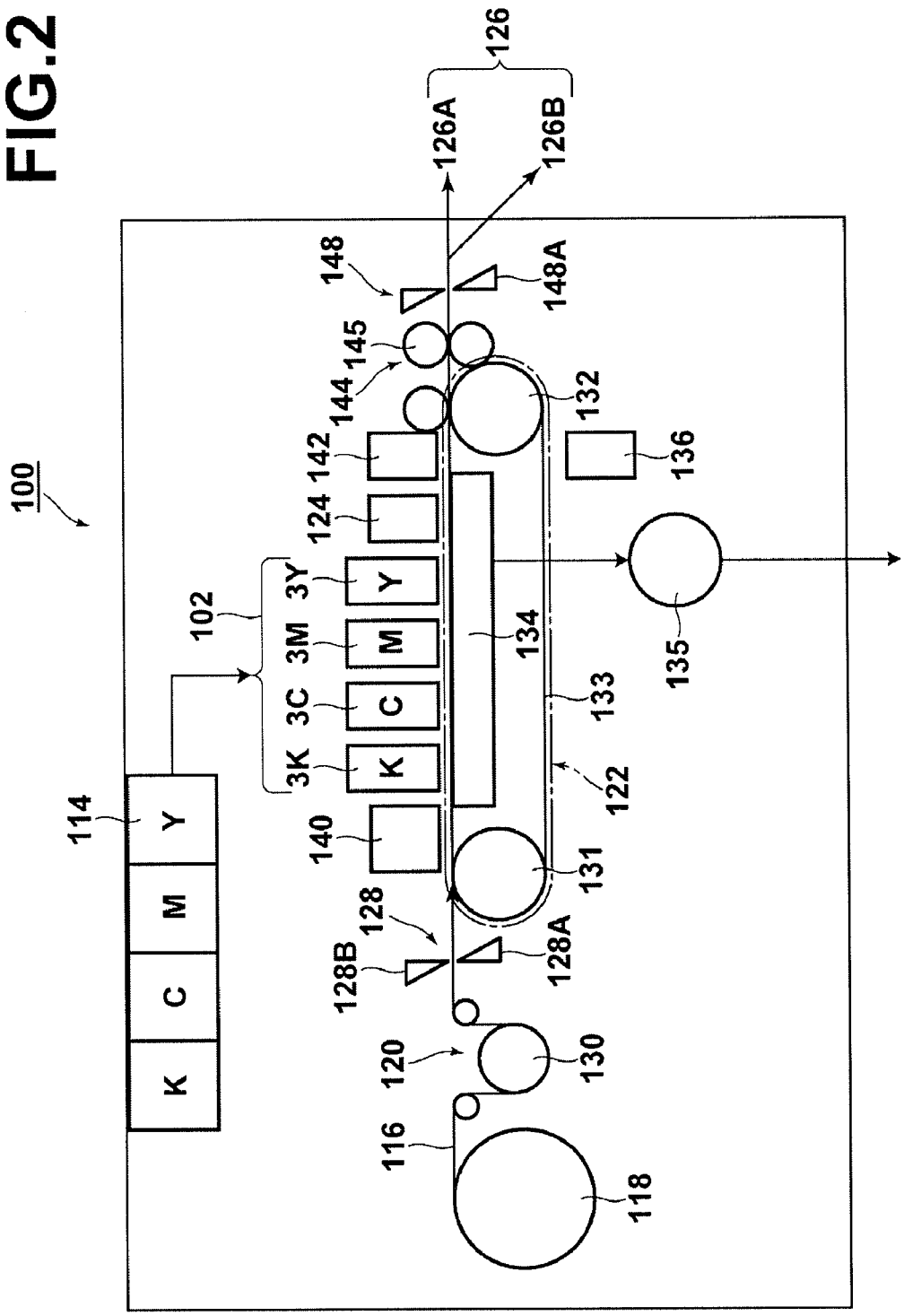
FIG. 2 illustrates an example construction of an inkjet recording device having the inkjet recording head shown in FIG. 1.
Figure 3:
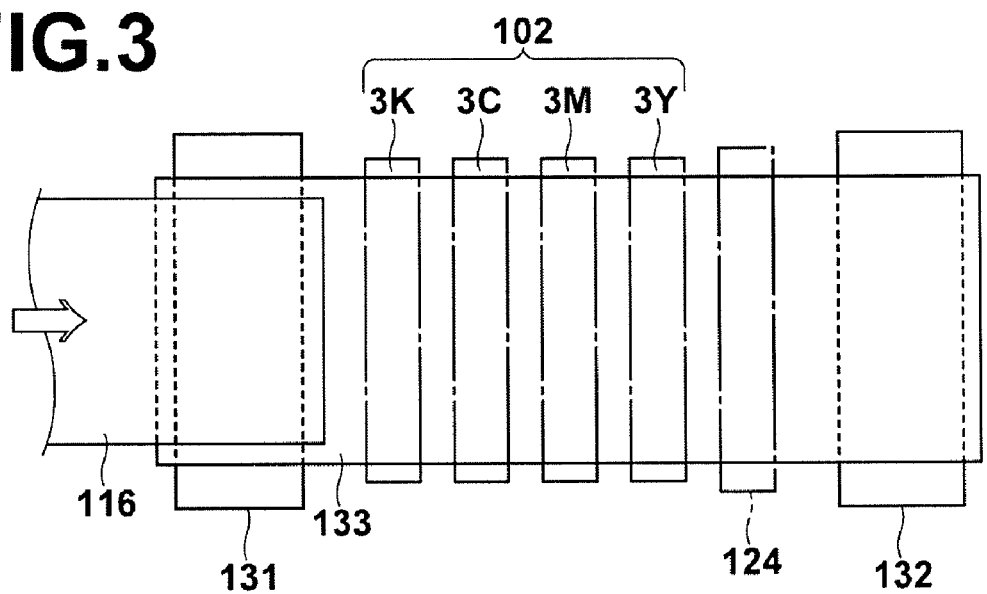
FIG. 3 is a partial top view of the inkjet recording device shown in FIG. 2.

An example configuration of an inkjet recorder having an inkjet recording head 3 according to the embodiment described above will be described with reference to FIGS. 2 and 3. FIG. 2 is an overall view and FIG. 3 is a partial top view of the recorder.

Illustrated inkjet recorder 100 basically includes print section 102 having a plurality of inkjet recording heads (hereinafter, simply "heads" or "head") 3K, 3C, 3M, and 3Y, each for each ink color, ink storage/mount section 114 for storing inks to be supplied to each of heads 3K, 3C, 3M, and 3Y, paper feed section 118 for feeding recording paper 116, decurling section 120 for decurling recording paper 116, suction belt conveyor 122, disposed opposite to the nozzle surface (discharge surface) of print section 102, for conveying recording paper 116 while maintaining flatness of recording paper 116, print detection section 124 for reading a result of printing performed by print section 102, and paper discharge section 126 for discharging a printed paper (printed material) to the outside. Each of Heads 3K, 3C, 3M, and 3Y constituting print section 102 corresponds to inkjet recording head 3 according to the embodiment described above.

In decurling section 120, recording paper 116 is decurled by heating with heating drum 130 in the direction opposite to the curled direction of recording paper 116 wound on a roll. For the recorder that uses a roll paper, cutter 128 for cutting the roll paper is provided at a latter stage of decurling section 120, as illustrated in FIG. 2, and the roll paper is cut out to a desired size. Cutter 128 includes fixed blade 128A having a length greater than the width of the conveyor path and round blade 128B that moves along fixed blade 128A, in which fixed blade 128A is provided on the rear side of the printing surface and round blade 128B is provided on the printing surface side across the conveyor path. The recorder that uses a cut sheet does not require cutter 128.

Decurled and cutout recording paper 116 is fed to suction belt conveyor 122. Suction belt conveyor 122 includes rollers 131, 132, and endless belt 133 wound between them, and configured such that at least the portion opposite to the nozzle surface of print section 102 and the sensor surface of print detection section 124 becomes a level plane (flat plane).

Belt 133 has a width greater than that of recording paper 116 and many suction holes (not shown) are formed in the belt face. Suction chamber 134 is provided at the position opposite to the nozzle surface of print section 102 and the sensor surface of print detection section 124 in the inner side of belt 133 wound between rollers 131, 132. Suction chamber 134 is suctioned by fan 135 so as to have a negative pressure, thereby suction-holding recording paper 116 on belt 133.

Power is supplied to at least either one of rollers 131, 132 from a motor (not shown), whereby belt 133 is driven in clockwise direction in FIG. 2 and recording paper 116 held on belt 133 is conveyed from left to right in FIG. 2.

When a borderless print or the like is printed, the ink adheres also to belt 133, so that belt cleaning section 136 is provided at a predetermined position (appropriate position other than the printing area) on the outer side of belt 133.

Heating fan 140 is provided on the upstream side of print section 102 on the paper conveyer path formed by suction belt conveyor 122. Heating fan 140 blows heated air onto recording paper 116 before printing to heat recording paper 116. By heating recording paper 116 immediately preceding the printing, spotted inks on recording paper 116 are dried faster.

Print section 102 is a so-called full line head in which line heads having a length corresponding to a maximum paper width are disposed in a direction (main scanning direction) orthogonal to the paper feed direction (FIG. 3). Each of printing heads 3K, 3C, 3M, and 3Y is a line head having a plurality of ink discharge openings (nozzles) disposed over a length which exceeds at least one side of maximum size of recording paper 116.

Heads 3K, 3C, 3M, and 3Y corresponding to black (K), cyan (C), magenta (M), and yellow (Y) are disposed in this order from the upstream side along the paper feed direction of recording paper 116. A color image is recorded on recording paper 116 while being conveyed by discharging a color ink from each of heads 3K, 3C, 3M, and 3Y. Print detection section 124 is constituted by a line sensor or the like for imaging inkjet results of print section 102 to detect an inkjet fault, such as clogging of a nozzle, from the obtained inkjet image.

Post drying section 142 constituted by a heating fan or the like for drying the printed image surface is provided at the latter stage of print detection section 124. It is desirable that the printed surface avoids any contact until the inks are dried, so that a method of blowing heated air is preferable. Heating/pressing section 144 for controlling the glossiness of an image surface is provided at the latter stage of post drying section 142. In heating/pressing section 144, the image surface is pressed, while being heated, by pressing rollers 145 having a predetermined uneven surface shape to transfer the uneven shape to the image surface.

The printed material obtained in the manner described above is discharged from paper discharge section 126. Preferably, an intended print (print on which an intended image is printed) and a test print are discharged separately. Inkjet recorder 100 includes a selection means (not shown) for selecting and switching paper discharge paths between intended prints and test prints to send them discharge section 126A and 126B respectively. Where an intended image and a test image are printed on a large paper in parallel at the same time, cutter 148 may be provided to separate the test print portion. Inkjet recorder 100 is structured in the manner described above.

(Design Change)

The present invention is not limited to the embodiment described above, and design changes and modifications may be made without departing from the sprit of the present invention.

Examples and Comparative Examples according to the present invention will now be described.

Example 1

A 20 nm thick Ti film and a 150 nm thick (111) Ir film was formed on a Si wafer in this order by sputtering as the lower electrode. Then, an Nb-PZT piezoelectric film was formed on the lower electrode. When forming the Nb-PZT piezoelectric film, an initial layer was formed first with a thickness of 150 nm at a substrate temperature of 420° C., and then a main layer was formed by changing the setting temperature of the substrate to 450° C. It took about 10 minutes from the time when the setting temperature was changed to the time when the substrate temperature actually reached the new setting temperature. The total thickness of the Nb-PZT piezoelectric film was 4 μm.

Other film forming conditions of the piezoelectric film are as follows:

Film Forming Device Used: RF Sputtering system (MPS Sputtering System for Ferroelectric Film Forming, ULVAC, Inc.)

Target: 120 mmφ Sintered Body of $Pb_{1.3}((Zr_{0.52}Ti_{0.48})_{0.88}Nb_{0.12})O_3$ Film Forming Power: 500 W Distance between Substrate and Target: 60 mm Film Forming Pressure: 0.3 Pa Film Forming Gas: $Ar/O_2 = 97.5/2.5$ (Molar Ratio)

An XRD analysis was performed on the obtained piezoelectric film by θ/2θ measurement using an X-ray diffractometer, ULTIMA for thin film evaluation (Rigaku Corporation, Japan). The piezoelectric film obtained was a (100) oriented film having perovskite structure. The orientation degree F. measured by Lotgerling method was 99%. No peak of pyrochlore phase was observed, and the piezoelectric film obtained was a good crystal film having a single phase perovskite structure. "Peaks of pyrochlore phase" will appear near $2\theta = 29.4°$ which is the (222) plane of $Pb_2Nb_2O_7$ pyrochlore and $2\theta = 34.1° \pm 1°$ which is the (400) plane thereof.

As the amount of pyrochlore (%), ΣI (pyrochlore)/((ΣI (perovskite)+ΣI (pyrochlore)) was measured. Here, ΣI (pyrochlore) is the total reflection intensity from pyrochlore phase, and ΣI (perovskite) is the total reflection intensity from perovskite phase. In the present Example, any diffraction peak was not observed, and therefore the amount of pyrochlore was 0%.

An X-ray fluorescence measurement was performed on the obtained piezoelectric film using an X-ray fluorescence instrument, Axios (PANalytical Inc.) to measure the molar ratio a/b between A-site element and B-site element (=Pb/(Zr+Ti+Nb), the result of which was 1.06.

Finally, a Ti/Pt upper electrode was deposited on the PZT film (Ti with a thickness of 20 nm, functioning as a contact layer and Pt with a thickness of 150 nm, mainly functioning as an electrode) to obtain a piezoelectric device of the present invention.

The piezoelectric constants $d_{31}(+)$, $d_{31}(-)$, and average lifetime were measured for the obtained piezoelectric device. The results were: $d_{31}(+)=50$ pm/V, $d_{31}(-)=240$ pm/V, and average lifetime=98 billion cycles. In the present Example, an Nb-PZT film having high piezoelectric performance and high durability could be formed.

Examples 2 to 4 and Comparative Examples 1 to 7

Piezoelectric devices were obtained under the same conditions as those of Example 1 other than the film forming temperatures of piezoelectric films as shown in Table 1. The evaluation results are shown in Tables 1 and 2. In each of Nb-PZT films obtained in Examples 1 to 4, a/b≦1.06, and each film was a good crystal film having a single phase perovskite structure having both high piezoelectric performance and high durability.

In each of Comparative Examples 1 to 3 in which a film was formed at a constant temperature not greater than 440° C. from the beginning to the end without changing the temperature in the middle of the film formation, the obtained Nb-PZT film was in a/b≧1.07 and the film was a good crystal film having a single phase perovskite structure without pyrochlore phase but showed insufficient durability with the average lifetime of not greater than 25 billion cycles.

Figure 4:
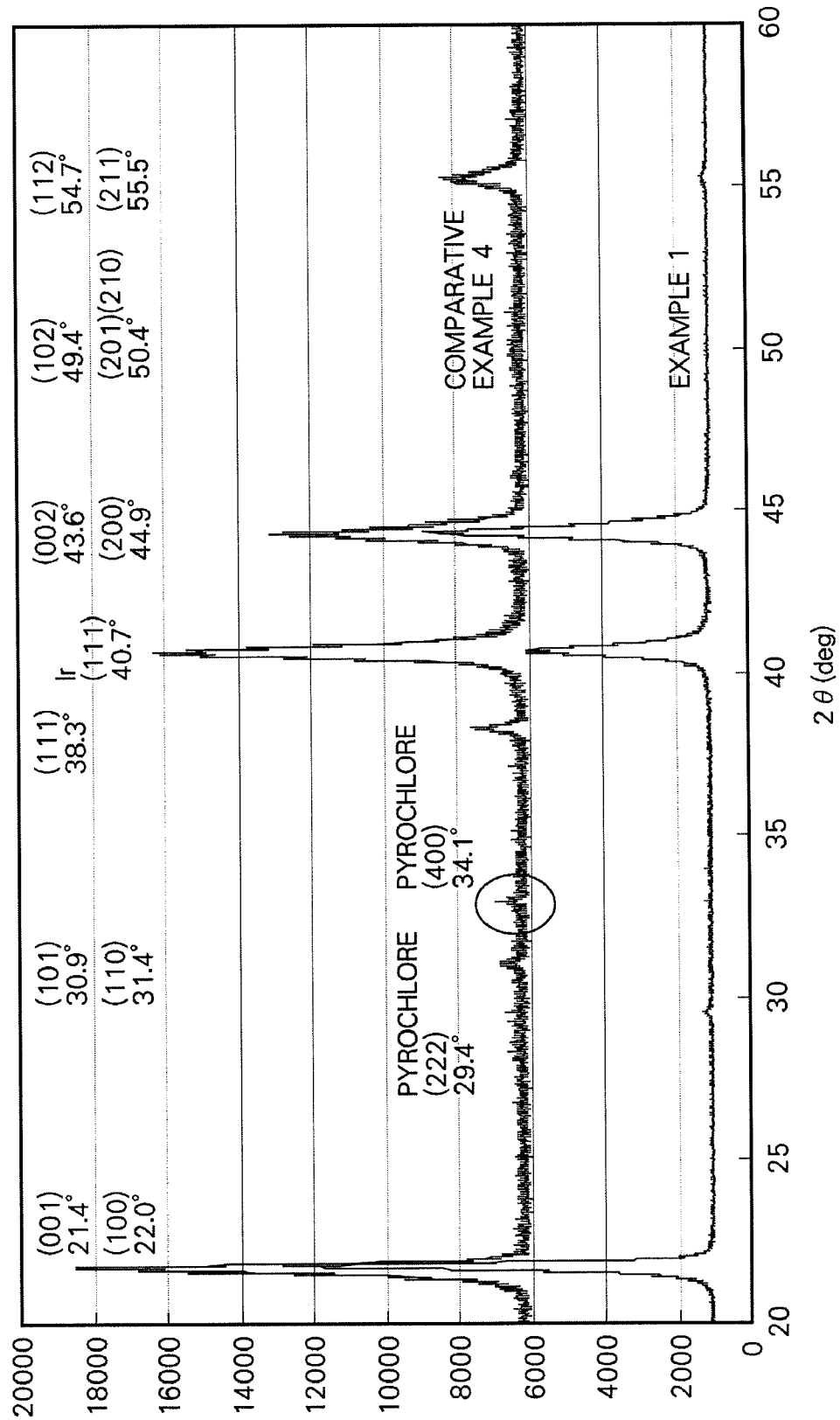
FIG. 4 shows XRD patterns of piezoelectric films of Example 1 and Example 4.

In each of Comparative Examples 4, 5, and 7 in which film forming was performed at a constant temperature not less than 450° C. from the beginning to the end without changing the temperature in the middle of the film formation, the obtained Nb-PZT film was in a/b≦1.06 and pyrochlore phase was formed, showing unsatisfactory piezoelectric performance. In Comparative Example 7, the amount of pyrochlore was 100% and the Nb-PZT film was detached from the substrate after formed. Therefore, the upper electrode could not be formed, and piezoelectric constant and average lifetime measurements could not be carried out. An XRD pattern of piezoelectric film of Comparative Example 4 is shown in FIG. 4.

In Comparative Example 6 in which film forming temperature was changed during the film formation, as in Example 4, with an initial layer of a thickness of 10 nm, the obtained Nb-PZT film has pyrochlore phase and showed insufficient piezoelectric performance. It can be said that a too thin initial layer can not provide a sufficient function as a crystal core.

Figure 5:
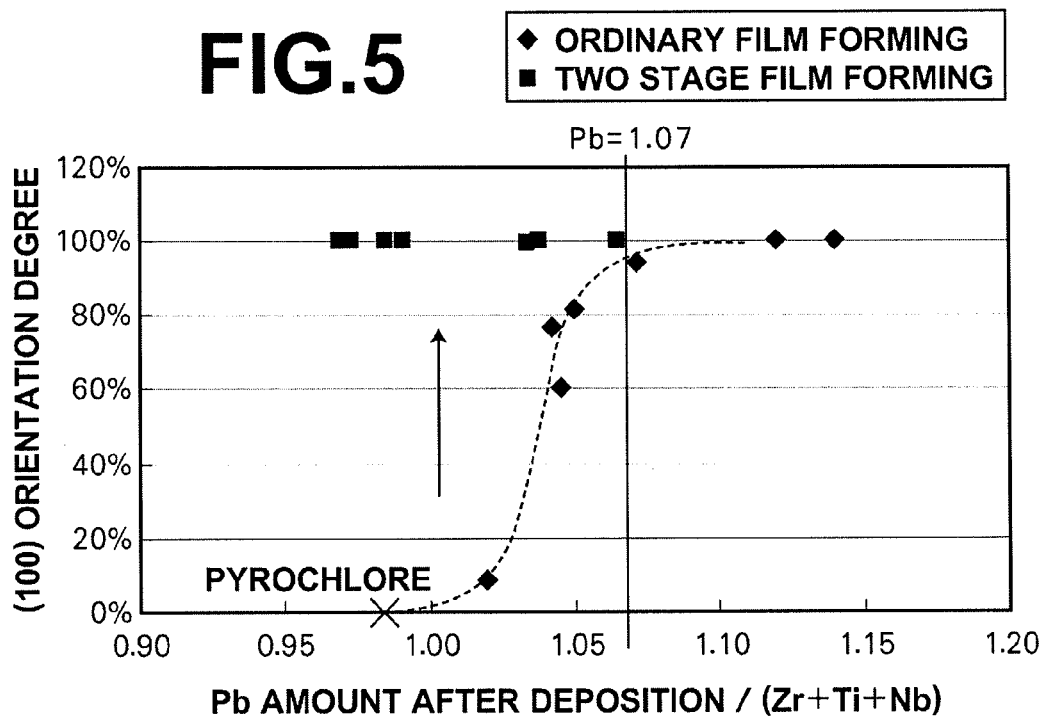
FIG. 5 is a graph illustrating the relationship between a/b and crystal orientation degree of Examples 1 to 4, and Comparative Examples 1 to 5 and 7.

FIG. 5 shows the relationship between a/b and crystal orientation degree of Examples 1 to 4, Comparative Examples 1 to 5 and 7, and films formed under similar conditions to those of Examples 1 to 4 and Comparative Examples 1 to 5 and 7. In FIG. 5, ◆ indicates data of Comparative Examples 1 to 5 and 7 formed through an ordinary film forming process and of a film formed under similar conditions to those of Comparative Examples 1 to 5 and 7, and ■ indicates data of Examples 1 to 4 formed through a two-stage film forming process and of a film formed under similar conditions to those of Examples 1 to 4. In conventional film forming methods, a low crystal orientation degree is provided under a low a/b condition, while in the present invention, a good crystal film having a high crystal orientation degree can be formed even under a low a/b condition.

FIG. 6 shows the relationship between a/b and average lifetime with respect to Examples 1 to 4 and Comparative Examples 1 to 3 that do not include pyrochlore phase. With a/b=1.06 as the border, the average life time increases rapidly in the area under the border. When a/b≧1.07, it is presumed that even in perovskite single phase, an amorphous lead oxide undetectable by XRD presents in grain boundaries and the like, causing leakage current to flow during operation and the average lifetime is reduced. When a/b≦1.06, it is thought that the amorphous lead oxide presents ingrain boundaries and the like disappears and the average lifetime is increased rapidly.

Example 5

An piezoelectric device of the present invention was produced in the same manner as in Example 1 other than the target composition which is changed to $Pb_{1.3}(Zr_{0.52}Ti_{0.48})O_3$. It has been confirmed that, for pure PZT, a piezoelectric film having pyrochlore free single phase perovskite structure with a/b≦1.06 can be produced by sequentially performing process (A) in which the film forming is performed under the condition of a/b≧1.07 and process (B) in which the film forming is performed under the condition of a/b<1.07. The obtained piezoelectric film has both excellent piezoelectric performance and durability. The pure PZT not doped with Nb has a relatively low piezoelectric performance than Nb-PZT, but the durability is improved in comparison with Nb-PZT by the amount corresponding to the lesser amount of displacement.

Example Experiment

The inventors of the present invention have studied an appropriate thickness of the initial layer, results of which are shown in Table 3. Table 3 clearly shows that the thickness of the initial layer is preferable to be not less than 30 nm.

TABLE 1

| | Film Forming Temp. for Initial layer (Initial layer Thickness) | Film Forming Temp. for Main layer | a/b | Pyrochlore Amount (%) |
|---|---|---|---|---|
| Example 1 | 420° C. (150 nm) | 450° C. | 1.06 | 0 |
| Example 2 | 420° C. (150 nm) | 460° C. | 1.04 | 0 |
| Example 3 | 420° C. (150 nm) | 480° C. | 1.02 | 0 |
| Example 4 | 420° C. (150 nm) | 510° C. | 0.97 | 0 |
| Comp. Example 1 | 420° C. | | 1.12 | 0 |
| Comp. Example 2 | 430° C. | | 1.09 | 0 |
| Comp. Example 3 | 440° C. | | 1.07 | 0 |
| Comp. Example 4 | 450° C. | | 1.06 | 2 |
| Comp. Example 5 | 480° C. | | 1.02 | 5 |

TABLE 1-continued

| | Film Forming Temp. for Initial layer (Initial layer Thickness) | Film Forming Temp. for Main layer | a/b | Pyrochlore Amount (%) |
|---|---|---|---|---|
| Comp. Example 6 | 420° C. (10 nm) | 510° C. | 0.97 | 7 |
| Comp. Example 7 | | 510° C. | 0.95 | 100 |

TABLE 2

| | a/b | Pyrochlore Amount (%) | $d_{31}$ (+) (pm/V) | $d_{31}$ (−) (pm/V) | Average Lifetime (Hundred Million Cycles) |
|---|---|---|---|---|---|
| Example 1 | 1.06 | 0 | 50 | 240 | 980 |
| Example 2 | 1.04 | 0 | 60 | 250 | 1050 |
| Example 3 | 1.02 | 0 | 190 | 200 | 780 |
| Example 4 | 0.97 | 0 | 210 | 60 | 850 |
| Comp. Example 1 | 1.12 | 0 | 10 | 250 | 50 |
| Comp. Example 2 | 1.09 | 0 | 30 | 240 | 120 |
| Comp. Example 3 | 1.07 | 0 | 20 | 250 | 250 |
| Comp. Example 4 | 1.06 | 2 | 30 | 140 | 280 |
| Comp. Example 5 | 1.02 | 5 | 100 | 100 | 210 |
| Comp. Example 6 | 0.97 | 7 | 90 | 40 | 150 |
| Comp. Example 7 | 0.95 | 100 | unmeasurable | unmeasurable | unmeasurable |

TABLE 3

| Film thickness of Initial Layer | (100) Orientation Perovskite Amount | Pyrochlore Amount |
|---|---|---|
| 0 nm | 0% | 100% |
| 10 nm | 93% | 7% |
| 30 nm | 100% | 0% |
| 100 nm | 100% | 0% |

INDUSTRIAL APPLICABILITY

The piezoelectric film and method for manufacturing the same according to the present invention may be preferably applied to actuators mounted on inkjet recording heads, magnetic read/write heads, MEMS (micro electro-mechanical systems) devices, micropumps, ultrasonic probes, ultrasonic motors, and the like, and ferroelectric devices, such as ferroelectric memories and the like.

What is claimed is:

1. A piezoelectric film of a perovskite oxide, which may include an unavoidable impurity, piezoelectric film of the perovskite oxide being represented by a general expression (P) below,
wherein the film has a pyrochlore free single phase perovskite structure with a/b≦1.06, $$Pb_a(Zr_x,Ti_y,M_{b-x-y})_bO_c \quad (P)$$

where M represents one or more types of metal elements, and
0<x<b, 0<y<b, 0≦b−x−y.

2. The piezoelectric film of claim 1, wherein the perovskite oxide represented by the general expression (P) is a perovskite oxide (PX) in which 0≦b−x−y and M includes at least one type of element selected from the group consisting of V, Nb, Ta, and Sb.

3. The piezoelectric film of claim 1, wherein the film has an average lifetime of not less than 50 billion cycles when measured under the conditions of a temperature of 40° C. and a relative humidity of 80% in the following manner:
piezoelectric constants $d_{31}$ of the piezoelectric film are measured with the film in the form of a piezoelectric device in which a lower electrode is formed on a substrate side of the piezoelectric film and multiple upper electrodes are formed on a side opposite to the substrate, each upper electrode having a laminated structure of a 20 nm thick Ti film and a 150 nm thick Pt film stacked in this order and an area of 0.6 mm²;
a piezoelectric constant $d_{31}$ measured with a sine wave voltage of 1 kHz with an offset of 10 V and an amplitude of ±10 V is defined as $d_{31}$(+), and a piezoelectric constant $d_{31}$ measured with a sine wave voltage of 1 kHz with an offset of −10 V and an amplitude of ±10 V is defined as $d_{31}$(−); and
when $d_{31}$(+)≧$d_{31}$(−), a 100 kHz trapezoidal wave of 12.5 V±12.5 V is applied, and when $d_{31}$(−)≧$d_{31}$(+), a 100 kHz trapezoidal wave of −12.5 V±12.5 V is applied, in either case of which the application of the voltage is stopped every one billion cycles, which is every 16.7 minutes since 100 kHz×one billion cycles=16.7, to measure a tan δ value at 1 V, 1 kHz with an LCR meter and a point where the tan δ value exceeds 0.1 is obtained as a lifetime, and an average of the measured lifetimes at 20 points randomly selected from the multiple upper electrodes formed on the piezoelectric film is obtained as the average lifetime.

4. The piezoelectric film of claim 1, wherein the film has a piezoelectric constant $d_{31}$ which is not less than 150 pm/V.

5. The piezoelectric film of claim 1, wherein the film is formed by a vapor deposition method that sequentially performs a process (A) in which film forming is performed under the condition of a/b≧1.07 and a process (B) in which film forming is performed under the condition of a/b<1.07.

6. The piezoelectric film of claim 5, wherein a film forming temperature in the process (A) is relatively low compared to that of the process (B).

7. The piezoelectric film of claim 1, wherein the film is formed on any one of a silicon substrate, a silicon oxide substrate, and a SOI substrate.

8. The piezoelectric film of claim 1, wherein the film has a film thickness of not less than 3.0 μm.

9. A piezoelectric device having the piezoelectric film of claim 1 and electrodes for applying an electric field to the film.

10. A liquid discharge apparatus, comprising:
the piezoelectric device of claim 9; and
a liquid discharge member provided adjacent to the piezoelectric device, the liquid discharge member having a liquid storage chamber for storing a liquid and a liquid discharge opening for discharging the liquid from the liquid storage chamber to the outside according to the application of the electric field to the piezoelectric film.

11. The piezoelectric film of claim 1, wherein for said film having said pyrochlore free single phase perovskite structure, no diffraction peak of pyrochlore phase is observed in an XRD measurement.